US007526422B1

(12) United States Patent  
Nemecek

(10) Patent No.: US 7,526,422 B1  
(45) Date of Patent: Apr. 28, 2009

(54) SYSTEM AND A METHOD FOR CHECKING LOCK-STEP CONSISTENCY BETWEEN AN IN CIRCUIT EMULATION AND A MICROCONTROLLER

(75) Inventor: Craig Nemecek, Seattle, WA (US)

(73) Assignee: Cypress Semiconductor Corporation, San Jose, CA (US)

(*) Notice: Subject to any disclaimer, the term of this patent is extended or adjusted under 35 U.S.C. 154(b) by 861 days.

(21) Appl. No.: 09/992,076

(22) Filed: Nov. 13, 2001

(51) Int. Cl.  
*G06F 9/455* (2006.01)

(52) U.S. Cl. .................. 703/28; 714/28; 714/29; 714/30

(58) Field of Classification Search ............. 703/28; 714/28, 29–30  
See application file for complete search history.

(56) References Cited

U.S. PATENT DOCUMENTS

| | | | |
|---|---|---|---|
| 4,176,258 A * | 11/1979 | Jackson ............... | 714/30 |
| 4,670,838 A | 6/1987 | Kawata | |
| 4,757,534 A | 7/1988 | Matyas et al. | |
| 4,939,637 A | 7/1990 | Pawloski | |
| 4,964,074 A | 10/1990 | Suzuki et al. | |
| 4,969,087 A | 11/1990 | Tanagawa et al. | |
| 5,050,168 A | 9/1991 | Paterson | |
| 5,127,103 A | 6/1992 | Hill et al. | |
| 5,202,687 A | 4/1993 | Distinti | |
| 5,313,618 A | 5/1994 | Pawloski | |
| 5,321,828 A | 6/1994 | Phillips et al. | |
| 5,325,512 A | 6/1994 | Takahashi | |
| 5,329,471 A | 7/1994 | Swoboda et al. | |
| 5,331,571 A | 7/1994 | Aronoff et al. | |
| 5,339,262 A | 8/1994 | Rostoker et al. | |
| 5,357,626 A * | 10/1994 | Johnson et al. ............... | 714/33 |

(Continued)

FOREIGN PATENT DOCUMENTS

EP    1205848 A1    5/2002

OTHER PUBLICATIONS

Stan Augarten, "The Chip Collection—Introduction—Smithsonian Institute", "State Of The Art", "The First 256-Bit Static RAM", retrieved on Nov. 14, 2005 from http://smithsonianchips.si.edu/augarten/p24.htm.*

(Continued)

*Primary Examiner*—Paul L Rodriguez  
*Assistant Examiner*—Jason Proctor

(57) ABSTRACT

A system and a method for checking consistency of a lock-step process while debugging a microcontroller code. A host device copies a partially copies a production microcontroller in an ICE (in-circuit emulation) to form a virtual microcontroller. The virtual microcontroller and the microcontroller simultaneously and independently run a microcontroller code for debugging purposes. The microcontroller residing on a test circuit includes a first memory and the virtual microcontroller residing in the ICE includes a second memory. A host computer copies a content of the first memory and a content of the second memory in the host computer memory when the execution of the code is halted. Software in the host device compares the content of the first memory and the content of the second memory for consistency. In case of a disparity between the content of the first memory and the content of the second memory, a user traces the execution of the code in a trace buffer residing in the ICE and debugs the faulty code accordingly.

19 Claims, 3 Drawing Sheets

U.S. PATENT DOCUMENTS

| | | | |
|---|---|---|---|
| 5,371,878 A * | 12/1994 | Coker | 703/28 |
| 5,416,895 A | 5/1995 | Anderson et al. | |
| 5,438,672 A | 8/1995 | Dey | |
| 5,455,927 A | 10/1995 | Huang | |
| 5,493,723 A | 2/1996 | Beck et al. | |
| 5,495,593 A | 2/1996 | Elmer et al. | |
| 5,495,594 A | 2/1996 | MacKenna et al. | |
| 5,546,562 A | 8/1996 | Patel | |
| 5,559,996 A | 9/1996 | Fujioka et al. | |
| 5,564,108 A | 10/1996 | Hunsaker et al. | |
| 5,572,665 A | 11/1996 | Nakabayashi et al. | |
| 5,574,852 A | 11/1996 | Bakker et al. | |
| 5,574,892 A | 11/1996 | Christensen | |
| 5,587,957 A | 12/1996 | Kowalczyk et al. | |
| 5,590,354 A | 12/1996 | Klapproth et al. | |
| 5,594,890 A | 1/1997 | Yamaura et al. | |
| 5,630,052 A | 5/1997 | Shah | |
| 5,630,102 A | 5/1997 | Johnson et al. | |
| 5,663,900 A | 9/1997 | Bhandari et al. | |
| 5,675,825 A | 10/1997 | Dreyer et al. | |
| 5,691,898 A | 11/1997 | Rosenberg et al. | |
| 5,748,875 A | 5/1998 | Tzori | |
| 5,752,013 A | 5/1998 | Christensen et al. | |
| 5,754,552 A | 5/1998 | Allmond et al. | |
| 5,758,058 A | 5/1998 | Milburn | |
| 5,784,545 A | 7/1998 | Anderson et al. | |
| 5,802,290 A | 9/1998 | Casselman | |
| 5,805,792 A | 9/1998 | Swoboda et al. | |
| 5,841,996 A | 11/1998 | Nolan et al. | |
| 5,852,733 A | 12/1998 | Chien et al. | |
| 5,874,958 A | 2/1999 | Ludolph | |
| 5,883,623 A | 3/1999 | Cseri | |
| 5,889,988 A | 3/1999 | Held | |
| 5,895,494 A | 4/1999 | Scalzi et al. | |
| 5,903,718 A | 5/1999 | Marik | |
| 5,911,059 A * | 6/1999 | Profit, Jr. | 703/23 |
| 5,933,816 A | 8/1999 | Zeanah et al. | |
| 5,964,893 A | 10/1999 | Circello et al. | |
| 5,968,135 A | 10/1999 | Teramoto et al. | |
| 5,978,584 A | 11/1999 | Circello et al. | |
| 5,983,277 A | 11/1999 | Heile et al. | |
| 5,999,725 A | 12/1999 | Barbier et al. | |
| 6,002,398 A | 12/1999 | Wilson | |
| 6,009,270 A | 12/1999 | Mann | |
| 6,014,135 A | 1/2000 | Fernandes | |
| 6,016,554 A | 1/2000 | Skrovan et al. | |
| 6,016,563 A | 1/2000 | Fleisher | |
| 6,032,268 A | 2/2000 | Swoboda et al. | |
| 6,034,538 A | 3/2000 | Abramovici | |
| 6,052,524 A | 4/2000 | Pauna | |
| 6,058,263 A | 5/2000 | Voth | |
| 6,072,803 A | 6/2000 | Allmond et al. | |
| 6,075,941 A | 6/2000 | Itoh et al. | |
| 6,094,730 A | 7/2000 | Lopez et al. | |
| 6,104,325 A | 8/2000 | Liaw et al. | |
| 6,107,826 A | 8/2000 | Young et al. | |
| 6,121,965 A | 9/2000 | Kenney et al. | |
| 6,134,516 A | 10/2000 | Wang et al. | |
| 6,144,327 A | 11/2000 | Distinti et al. | |
| 6,161,199 A | 12/2000 | Szeto et al. | |
| 6,173,419 B1 * | 1/2001 | Barnett | 714/28 |
| 6,185,522 B1 | 2/2001 | Bakker | |
| 6,188,975 B1 | 2/2001 | Gay | |
| 6,202,044 B1 | 3/2001 | Tzori | |
| 6,223,144 B1 | 4/2001 | Barnett | |
| 6,223,147 B1 | 4/2001 | Bowers | |
| 6,223,272 B1 | 4/2001 | Coehlo et al. | |
| 6,239,798 B1 | 5/2001 | Ludolph et al. | |
| 6,263,302 B1 | 7/2001 | Hellestrand et al. | |
| 6,263,339 B1 | 7/2001 | Hirsch | |
| 6,263,484 B1 | 7/2001 | Yang | |
| 6,278,568 B1 | 8/2001 | Cloke et al. | |
| 6,282,547 B1 | 8/2001 | Hirsch | |
| 6,282,551 B1 | 8/2001 | Anderson et al. | |
| 6,289,300 B1 | 9/2001 | Brannick et al. | |
| 6,298,320 B1 | 10/2001 | Buckmaster et al. | |
| 6,304,101 B1 | 10/2001 | Nishihara | |
| 6,314,530 B1 | 11/2001 | Mann | |
| 6,332,201 B1 | 12/2001 | Chin et al. | |
| 6,345,383 B1 | 2/2002 | Ueki | |
| 6,347,395 B1 | 2/2002 | Payne et al. | |
| 6,356,862 B2 | 3/2002 | Bailey | |
| 6,366,878 B1 * | 4/2002 | Grunert | 703/28 |
| 6,371,878 B1 | 4/2002 | Bowen | |
| 6,374,370 B1 | 4/2002 | Bockhaus et al. | |
| 6,384,947 B1 | 5/2002 | Ackerman et al. | |
| 6,385,742 B1 | 5/2002 | Kirsch et al. | |
| 6,408,432 B1 | 6/2002 | Herrmann et al. | |
| 6,411,974 B1 | 6/2002 | Graham et al. | |
| 6,438,565 B1 | 8/2002 | Ammirato et al. | |
| 6,438,738 B1 | 8/2002 | Elayda | |
| 6,449,755 B1 | 9/2002 | Beausang et al. | |
| 6,453,461 B1 | 9/2002 | Chaiken | |
| 6,456,304 B1 | 9/2002 | Angiulo et al. | |
| 6,460,172 B1 * | 10/2002 | Insenser Farre et al. | 716/17 |
| 6,466,898 B1 | 10/2002 | Chan | |
| 6,487,700 B1 | 11/2002 | Fukushima | |
| 6,516,428 B2 | 2/2003 | Wenzel et al. | |
| 6,564,179 B1 | 5/2003 | Belhaj | |
| 6,581,191 B1 | 6/2003 | Schubert et al. | |
| 6,592,626 B1 | 7/2003 | Bauchot et al. | |
| 6,598,178 B1 | 7/2003 | Yee et al. | |
| 6,613,098 B1 | 9/2003 | Sorge et al. | |
| 6,618,854 B1 * | 9/2003 | Mann | 717/124 |
| 6,631,508 B1 | 10/2003 | Williams | |
| 6,658,633 B2 | 12/2003 | Devins et al. | |
| 6,678,877 B1 | 1/2004 | Perry et al. | |
| 6,681,280 B1 | 1/2004 | Miyake et al. | |
| 6,701,508 B1 | 3/2004 | Bartz et al. | |
| 6,711,731 B2 | 3/2004 | Weiss | |
| 6,715,132 B1 | 3/2004 | Bartz et al. | |
| 6,718,294 B1 | 4/2004 | Bortfeld | |
| 6,769,622 B1 | 8/2004 | Tournemille et al. | |
| 6,810,442 B1 | 10/2004 | Lin et al. | |
| 6,816,544 B1 | 11/2004 | Bailey et al. | |
| 6,825,869 B2 | 11/2004 | Bang | |
| 6,829,727 B1 | 12/2004 | Pawloski | |
| 6,865,504 B2 | 3/2005 | Larson et al. | |
| 6,922,821 B1 | 7/2005 | Nemecek | |
| 6,950,990 B2 | 9/2005 | Rajarajan et al. | |
| 6,957,180 B1 | 10/2005 | Nemecek | |
| 6,967,960 B1 | 11/2005 | Bross et al. | |
| 7,076,420 B1 | 7/2006 | Snyder et al. | |
| 7,089,175 B1 | 8/2006 | Nemecek et al. | |
| 7,099,818 B1 | 8/2006 | Nemecek | |
| 7,162,410 B1 | 1/2007 | Nemecek et al. | |
| 7,188,063 B1 | 3/2007 | Snyder | |
| 7,206,733 B1 | 4/2007 | Nemecek | |
| 7,236,921 B1 | 6/2007 | Nemecek et al. | |
| 2002/0052729 A1 | 5/2002 | Kyung et al. | |
| 2002/0091739 A1 | 7/2002 | Ferlitsch et al. | |
| 2002/0116168 A1 | 8/2002 | Kim | |
| 2002/0122060 A1 | 9/2002 | Markel | |
| 2002/0156885 A1 | 10/2002 | Thakkar | |
| 2002/0156929 A1 | 10/2002 | Hekmatpour | |
| 2002/0156998 A1 | 10/2002 | Casselman | |
| 2002/0188910 A1 | 12/2002 | Zizzo | |
| 2003/0056071 A1 | 3/2003 | Triece et al. | |
| 2003/0149961 A1 | 8/2003 | Kawai et al. | |
| 2003/0229877 A1 | 12/2003 | Bersch et al. | |

2004/0221238 A1 11/2004 Cifra et al.

OTHER PUBLICATIONS

"POD—Piece Of Data, Plain Old Documentation, Plain Old Dos, . . . ", retrieved on Nov. 14, 2005 from http://www.auditmypc.com/acronym/POD.asp.*

"Pod—Wikipedia, the free encyclopedia", retrieved on Nov. 14, 2005 from http://en.wikipedia.org/wiki/Pod.*

"Pod—definition by dict.die.net", retrieved on Nov. 14, 2005 from http://dict.die.net/pod.*

"In Circuit Emulators—descriptions of the major ICEs around", retrieved on Nov. 14, 2005 from http://www.algonet.se/~staffann/developer/emulator.htm.*

Wikipedia.org, "Von Neumann architecture", retrieved from http://en.wikipedia.org/wiki/Von_Neumann_architecture on Jan. 22, 2007, pp. 1-5.*

Dahl, et al.; "Emulation of the Sparcle Microprocessor with the MIT Virtual Wires Emulation System"; 1994; IEEE; pp. 14-22.

Bauer et al.; "a Reconfigurable Logic Machine for Fast Event-Driven Simulation"; 1998; Design Automation Conference Proceedings; pp. 668-671.

Bursky; "FPGA Combines Multiple Interfaces and Logic"; Electronic Design; vol. 48 No. 20; pp. 74-78; Oct. 2, 2000.

Anonymous; "F/Port: Fast Parallel Port for the PC: Installation Manual: Release 7.1"; circa 1997; available for download from http://www.fapo.com/fport.htm.

Nam et a.; "Fast Development of Source-Level Debugging System Using Hardware Emulation"; IEEE 2000; pp. 40-404.

Huang et al.; "Iceberg: An Embedded In-Circuit Emulator Synthesizer For Microcontrollers"; ACM 1999; pp. 580-585.

Khan et al.; "FPGA Architectures for Asic Hardware Emulators"; IEEE 1993; pp. 336-340.

Oh et al.; "Emulator Environment Based on an FPGA Prototyping Board"; IEEE 21-23; Jun. 2000; pp. 72-77.

Hong et al.; "An FPGA-Based Hardware Emulator for Fast Fault Emulation"; IEEE 1997; pp. 345-348.

Ching et al.; "An In-Circuit-Emulator for TMS320C25"; IEEE 1994; pp. 51-56.

Pasternak; "In-Circuit-Emulation in ASIC Architecture Core Designs"; IEEE 1989; pp. P6-4.1-P6-4.4.

Melear; "Using Background Modes for Testing, Debugging and Emulation of Microcontrollers"; IEEE 1997; pp. 90-97.

Walters; "Computer -Aided Prototyping For ASIC-Based Systems"; 1991; IEEE Design and Test of Computers.

Anonymous; "JEEN JTAG Embedded Ice Ethernet Interface"; Aug. 1999; Embedded Performance, Inc; 3 pages.

Sedory; "A Guide to Debug"; 2004; retrieved on May 20, 2005.

"Microsoft Files Summary Judgement Motions"; Feb. 1999; Microsoft PressPass; retrieved on May 20, 2005 from http://www.microsoft.com/presspass/press/1999/feb99//Feb99/Calderapr.asp; pp. 1-6.

Xerox; "Mesa Debugger Documentation"; Apr. 1979; Xerox Systems Development Department; Version 5.0; pp. 1-30.

Stallman et al.; "Debugging with the GNU Source-Level Debugger"; Jan. 1994; retrieved on May 2, 2005 from http://www.cs.utah.edu.

Wikipedia.org; "Von Neumann architecture"; retrieved from http://en.wikipedia.org/wiki/Von_Neumann_architecture on Jan. 22, 2007; pp. 1-5.

Stan Augarten; "The Chip Collection- Introduction- Smithsonian Institute"; "State of the Art"; "The First 256-Bit Static RAM"; retrieved on Nov. 14, 2005 frpm http://smithsonianchips.si.edu/augarten/p24.htm.

"POD- Piece of Data, Plain Old Documentation, Plain Old Dos . . . "; retrieved on Nov. 14, 2005 from http://www.auditmypc.com/acronym/POD.asp.

"Pod-Wikipedia, the free encyclopedia"; retrieved on Nov. 14, 2005 from http://en.wikipedia.org/wiki/POD.

"pod-definition by dict.die.net"; retrieved on Nov. 14, 2005 from http://dict.die.net/pod.

"In-Circuit Emulators- descriptions of the major ICEs around"; retrieved on Nov. 14, 2005 from htpp://www.algonet.se/~staffann/developer/emulator.htm.

Anonymous; "Using Debug"; 1999; Prentice-Hall Publishing; pp. 1-20.

Harrison et al.; "Xilinx FPGA Design in a Group Environment Using VHDL and Synthesis Tools"; Colloquium on Digital System Design Using Synthesis Techniques; Feb. 15, 1996; pp. 5/1-5/4.

Microsoft Press Computer User's Dictionary; 1998; p. 320.

Wikipedia- Main Page, retrieved on Mar. 8, 2006 from http://en.wikipedia.org/wiki/Main_Page and http://en.wikipedia.org/wiki/Wikipedia:Introduction.

Wikipedia; Processor register, retrieved on Mar. 7, 2006 from http://en.wikipedia.org/wiki/Processor_register.

Jonathan B. Rosenberg, "How Debugers Work", John Wiley & Sons, Inc., 1996. pp. i-256.

USPTO Notice of Allowance for U.S. Appl. No. 09/992,076, dated Nov. 13, 2006.

USPTO Notice of Allowance for U.S. Appl. No. 09/992,076, dated Mar. 26, 2008.

USPTO Notice of Allowance for U.S. Appl. No. 09/992,076, dated Nov. 29, 2007.

USPTO Final Rejection for U.S. Appl. No. 09/992,076, dated Jan. 30, 2007.

USPTO Non-Final Rejection for U.S. Appl. No. 09/992,076, dated Aug. 10, 2006.

USPTO Final Rejection for U.S. Appl. No. 09/992,076, dated Mar. 17, 2006.

USPTO Non-Final Rejection for U.S. Appl. No. 09/992,076, dated Nov. 21, 2005.

USPTO Non-Final Rejection for U.S. Appl. No. 09/992,076, dated Jun. 1, 2005.

USPTO Notice of Allowance for U.S. Appl. No. 09/994,600, dated Nov. 11, 2008.

USPTO Notice of Allowance for U.S. Appl. No. 09/994,600, dated May 14, 2008.

USPTO Final Rejection for U.S. Appl. No. 09/994,600, dated Oct. 17, 2007.

USPTO Non-Final Rejection for U.S. Appl. No. 09/994,600, dated May 15, 2007.

USPTO Final Rejection for U.S. Appl. No. 09/994,600, dated Dec. 8, 2006.

USPTO Non-Final Rejection for U.S. Appl. No. 09/994,600, dated Jul. 17, 2006.

USPTO Final Rejection for U.S. Appl. No. 09/994,600, dated Feb. 13, 2006.

USPTO Non-Final Rejection for U.S. Appl. No. 09/994,600, dated Aug. 23, 2005.

USPTO Final Rejection for U.S. Appl. No. 09/994,600, dated May 4, 2005.

USPTO Non-Final Rejection for U.S. Appl. No. 09/994,600, dated Oct. 21, 2004.

USPTO Notice of Allowance for U.S. Appl. No. 10/001,477, dated Nov. 10, 2008.

USPTO Final Rejection for U.S. Appl. No. 10/001,477, dated Jun. 30, 2008.

USPTO Non-Final Rejection for U.S. Appl. No. 10/001,477, dated Dec. 6, 2007.

USPTO Final Rejection for U.S. Appl. No. 10/001,477, dated Jul. 23, 2007.

USPTO Non-Final Rejection for U.S. Appl. No. 10/001,477, dated Jan. 22, 2007.

USPTO Final Rejection for U.S. Appl. No. 10/001,477, dated Aug. 24, 2006.

USPTO Non-Final Rejection for U.S. Appl. No. 10/001,477, dated Mar. 2, 2006.

USPTO Final Rejection for U.S. Appl. No. 10/001,477, dated Oct. 24, 2005.

USPTO Non-Final Rejection for U.S. Appl. No. 10/001,477, dated May 11, 2005.

USPTO Notice of Allowance for U.S. Appl. No. 10/002,217, dated Jan. 28, 2009.

USPTO Notice of Allowance for U.S. Appl. No. 10/002,217, dated Oct. 14, 2008.

USPTO Notice of Allowance for U.S. Appl. No. 10/002,217, dated Jun. 6, 2006.

USPTO Final Rejection for U.S. Appl. No. 10/002,217, dated Feb. 6, 2008.
USPTO Non-Final Rejection for U.S. Appl. No. 10/002,217, dated Aug. 3, 2007.
USPTO Final Rejection for U.S. Appl. No. 10/002,217, dated Mar. 7, 2007.
USPTO Non-Final Rejection for U.S. Appl. No. 10/002,217, dated Oct. 2, 2006.
USPTO Non-Final Rejection for U.S. Appl. No. 10/002,217, dated Apr. 3, 2006.
UPSTO Non-Final Rejection for U.S. Appl. No. 10/002,217, dated May 19, 2005.
USPTO Notice of Allowance for U.S. Appl. No. 09/989,777, dated Nov. 4, 2006.
USPTO Notice of Allowance for U.S. Appl. No. 09/989,777, dated Sep. 15, 2006.
USPTO Notice of Allowance for U.S. Appl. No. 09/989,777, dated Jul. 7, 2008.
USPTO Final Rejection for U.S. Appl. No. 09/989,777, dated Jan. 30, 2008.
USPTO Non-Final Rejection for U.S. Appl. No. 09/989,777, dated Sep. 11, 2007.
USPTO Final Rejection for U.S. Appl. No. 09/989,777, dated Mar. 13, 2007.
USPTO Non-Final Rejection for U.S. Appl. No. 09/989,777, dated Sep. 13, 2006.
USPTO Non-Final Rejection for U.S. Appl. No. 09/989,777, dated Apr. 11, 2006.
USPTO Final Rejection for U.S. Appl. No. 09/989,777, dated Dec. 21, 2005.
USPTO Non-Final Rejection for U.S. Appl. No. 09/989,777, dated Jul. 5, 2005.
USPTO Notice of Allowance for U.S. Appl. No. 09/994,601, dated Dec. 22, 2008.
USPTO Final Rejection for U.S. Appl. No. 09/994,601, dated Apr. 17, 2008.
USPTO Non-Final Rejection for U.S. Appl. No. 09/994,601, dated Oct. 4, 2007.
USPTO Final Rejection for U.S. Appl. No. 09/994,601, dated May 18, 2007.
USPTO Non-Final Rejection for U.S. Appl. No. 09/994,601, dated Nov. 14, 2006.
USPTO Final Rejection for U.S. Appl. No. 09/994,601, dated Mar. 8, 2006.
USPTO Non-Final Rejection for U.S. Appl. No. 09/994,601, dated Sep. 21, 2005.
USPTO Final Rejection for U.S. Appl. No. 09/994,601, dated Mar. 24, 3005.
USPTO Non-Final Rejection for U.S. Appl. No. 09/994,601, dated Jul. 29, 2004.
USPTO Notice of Allowance for U.S. Appl. No. 10/008,096, dated Dec. 12, 2008.
USPTO Final Rejection for U.S. Appl. No. 10/008,096, dated Jun. 16, 2008.
USPTO Non-Final Rejction for U.S. Appl. No. 10/008,096, dated Dec. 12, 2007.
USPTO Final Rejection for U.S. Appl. No. 10/008,096, dated Sep. 4, 2007.
USPTO Non-Final Rejection for U.S. Appl. No. 10/008,096, dated Mar. 7, 2007.
USPTO Final Rejection for U.S. Appl. No. 10/008,096, dated Oct. 13, 2006.
USPTO Non-Final Rejection for U.S. Appl. No. 10/008,096, dated Apr. 17, 2006.
USPTO Final Rejection for U.S. Appl. No. 10/008,096, dated Nov. 25, 2005.
USPTO Non-Final Rejection for U.S. Appl. No. 10/008,096, dated Jun. 24, 2005.
USPTO Final Rejection for U.S. Appl. No. 10/008,096, dated Feb. 10, 2005.
USPTO Non-Final Rejection for U.S. Appl. No. 10/008,096, dated Jun. 14, 2004.
Anonymous, "F/Port:Fast Parallel Port for the PC" Installation Manual Release 7.1, circa 1997, available for download from http://www.fapo.com/fport.htm pp. 1-25.
Anonymous, "Warp Nine Engineering - The IEEE 1284 Experts-F/Port Product Sheet," web page found at http://www.fapo.com/fport.htm Mar. 3, 2005.
Bursky, "FPGA Combines Multiple Interfaces and Logic," Electronic Design, vol. 48 No. 20, pp. 74-78 (Oct. 2, 2000).
"Webster's Third New International Dictionary", 1996, G. & C. Merriam Company pp. 1328-1329.
Five unnumbered pages from the U.S. Appl. 60/243,708 Oct. 26, 2000.
Ganapathy, Gopl, and Narayan, Ram, and Jorden, Glen, and Fernandez, Denzil, and Wang, Ming, and Nishimura, Jim; "Hardware Emulation for Functional Verification of K5", Jun. 1996, 33rd Design Automation Conference Proceedings, Jun. 3-7, 1996, pp. 315-318.
Hintz et al.; "Microcontrollers", 1992, McGraw-Hill, pp. 29-37.
Ito, Sergio Akira and Carro, Luigi, "A Comparison of Microcontrollers Targeted to FPGA-Based Embedded Applications". Sep. 2000, Proceedings of 13th Symposiuum on Integrated Circuits and Systems Design, Sep. 18-24, 2000, pp. 397-402.
Julio Faura et al.; "A Novel Mixed Signal Programmable Device With On-Chip Microprocessor", 1997, IEEE 1997 Custom Integrated Circuits Conference, pp. 103-568.
Monte Mar, Bert Sullam, Eric Blom; "An architecture for a configurable mixed-signal device", 2003. IEEE Journal of Solid-State Circuits, vol. 3, pp. 565-568.
Robinson, Gordon D; "Why 1149.1 (JTAG) Really Works", May 1994, Conference Proceedings Electro/94 International, May 10-12, 1994, Combined Volumes, pp. 749-754.
Walters, Stephen; "Computer-Aided Prototyping for ASIC-Based Systems", 1991, IEEE Design & Test of Computers; vol. 8, Issue 2, pp. 4-10.
"PSoC designer: Integrated development environment, getting started 25-minute tutorial, version 1.0", Cypress Microsystems., Cypress Microsystems, Inc. CMS 10006A, Jul. 3, 2001. pp. 1-25.
"PSoC technology complete changes 8-bit MCU system design", Cypress Microsystems, Inc. retrieved from <http>://www.archive.org/web/20010219005250/http://cypressmicro.com-/t . . . >, Feb. 19, 2001. pp. 1-21.
Specks et al., "A Mixed Digital-Analog 16B Microcontroller with 0.5MB Flash Memory, On-Chip Power Supply, Physical Nework Interface, and 40V I/O for Automotive Single-Chip Mechatronics," IEEE, Feb. 9, 2000, pp. 348-349.
Hsieh et al., "Modeling Micro-Controller Peripherals for High-Level Co-Simulation and Synthesis," IEEE, 1997, pp. 127-130.

* cited by examiner

SYSTEM AND A METHOD FOR CHECKING LOCK-STEP CONSISTENCY BETWEEN AN IN CIRCUIT EMULATION AND A MICROCONTROLLER

FIELD OF INVENTION

This invention relates generally to the field of in circuit emulation (ICE). More specifically, an embodiment of the present invention relates to a method and system for "lock-step" consistency checking between an ICE and a production microcontroller.

BACKGROUND OF THE INVENTION

In circuit emulation (ICE) has been used by software and hardware developers for a number of years as a development tool to emulate the operation of complex circuit building blocks and permit diagnosis and debugging of hardware and software. Such in circuit emulation is most commonly used to analyze and debug the behavior of complex devices such as microcontrollers and microprocessors that have internal structures that are far too complex to readily model using computer simulation software alone.

FIG. 1 illustrates an exemplary conventional in-circuit emulation arrangement 100 used to model, analyze and debug the operation of a microcontroller device. In this arrangement, a host computer (e.g., a personal computer) 110 is connected to a debug logic 120, which is further connected to a special version of the microcontroller device that has been developed specially for use in emulation. Traditionally, a microcontroller manufacturer would manufacture two versions of any one of its microcontrollers, a special version and a production version. The special version of the microcontroller includes specialized testing hardware (e.g., scan chains, registers, and the like) for supporting software debugging functions. The special version is only used for the purpose of testing and debugging microcontroller code, where the debugged microcontroller code is eventually loaded in the production version of the same microcontroller to be marketed.

A debugging operation starts with the host computer 110 loading instructions through debug logic block 120 to the special version of the microcontroller 130 where the instructions are executed. Depending upon the application, this operation may be monitored while the special version of the microcontroller 130 is interconnected with the circuitry that is intended to interface a production version of the microcontroller in the finished product under development. Such interconnection may be via simulation within the host computer 110 or as actual circuitry or some combination thereof. As the circuit is stepped through its operation, the debug logic gathers information about the state of various components of the microcontroller 130 during operation and feeds that information back to the host computer 110 for analysis.

During the course of the analysis, various trace information such as time stamps, register value, data memory content, etc., may be logged in the host computer 110 for analysis and debugging by the designer. Additionally, it is generally the case that various break points can be defined by the designer that cause the program to halt execution at various points in the operation to permit detailed analysis. Other debugging tools may also be provided to enable the user to debug the operation of the circuit.

Typically during the debugging process a designer would prefer to run the microcontroller in as much of a production world situation as possible. Therefore, a microcontroller is installed in a test circuit, which closely resembles the hardware that is to be controlled by the production version of the microcontroller under the test.

As described above, ICE is a conventional technique for debugging a microcontroller code. A typical ICE includes a production microcontroller used for debugging purposes, a virtual copy of the production microcontroller which exist in the base station unit and a host device. The production microcontroller comprises a memory, a CPU register, a SRAM, a program counter, and a file register. The host device copies a substantial part of the production microcontroller in the base station, which forms the virtual microcontroller. The base station comprises a memory, a CPU register, a SRAM, a program counter, and a file register.

Debugging process is initiated by software residing in the host device, which loads the microcontroller code in both production microcontroller and the virtual microcontroller. The Production microcontroller and the virtual microcontroller run the microcontroller code in a synchronized process. The Synchronization of the production microcontroller and the virtual microcontroller requires that the production microcontroller and the virtual microcontroller start running the microcontroller code at the same time, execute the same lines of code sequentially, and if there is a breakpoint in the code or if a user halts the execution for any purpose, both production and virtual microcontroller encounter the command at the same time. Furthermore, synchronization requires that during the course of debugging the microcontroller code, after execution of each line of the microcontroller code, the memory, the CPU register, and SRAM of the virtual microcontroller and the production microcontroller have the same value.

Therefore a need exists to ensure the integrity of the synchronized code execution when the debugging process if halted. Furthermore, a need exists to check the consistency of the synchronized execution process when the production microcontroller and the virtual microcontroller encounter a break point during the course of the execution of the microcontroller code. Also a need exist to ensure the memory contents of the production microcontroller and the ICE to mirror image one another. The present invention provides a novel solution to these requirements.

SUMMARY OF THE INVENTION

An embodiment of the present invention provides a user with capability to conduct a lock-step consistency check during a debugging process of a microcontroller code. One embodiment of the present invention provides a host device to read in a content of a memory in an ICE and a content of a memory in a production microcontroller into a memory residing in the host device. Another embodiment of the present invention provides software, residing in the host computer, to perform a consistency check and to verify the integrity of a lock-step process by comparing the contents of the memory in the ICE against the content of the memory in the production microcontroller when execution of the microcontroller code is halted. If the result of the comparison is a mismatch, the software residing in the host device issues a signal indicating a "lock-step error".

Another embodiment of the present invention provides a consistency check when a breakpoint is encountered. According to the lock-step process of this embodiment, the production microcontroller and the virtual microcontroller run the same microcontroller code step by step and in synchronization, therefore, both microcontrollers should be executing the same line of code even if the line of code is a breakpoint.

Accordingly, the lock-step process accesses the content of SRAM in the production microcontroller and the content of SRAM in the ICE to verify they have the same value and are mirror images of one another.

Another embodiment of the present invention provides a method for debugging a microcontroller code comprising the steps of initializing a first memory of an ICE (in circuit emulator) and a second memory of a production microcontroller and running the microcontroller code on the production microcontroller and the ICE simultaneously. A trace buffer residing in the ICE is used to locate the failed code of the microcontroller code. The content of the first memory and a content of the second memory are compared for consistency.

Another embodiment provides a system for checking consistency of a lock-step process while debugging a microcontroller codes. A host device contains a partial copy of a production microcontroller in an ICE to form a virtual microcontroller. The virtual microcontroller and a production microcontroller simultaneously and independently run a microcontroller code for debugging purposes. The production microcontroller resides on a test circuit and includes a first memory, and the virtual microcontroller resides in the ICE includes a second memory. A host computer copies a content of the first memory and a content of the second memory into the host computer memory when the execution of the microcontroller code is halted. Software in the host computer compares the content of the first memory and the content of the second memory for consistency. In case of a disparity between the content of the first memory and the content of the second memory, a user traces the execution of the code in a trace buffer residing in the ICE and debugs a faulty microcontroller code accordingly.

These and other objects and advantages of the present invention will become obvious to those of ordinary skill in the art after having read the following detailed description of the preferred embodiment which are illustrated in the various drawing figures.

BRIEF DESCRIPTION OF THE DRAWINGS

The feature of the invention believed to be novel are set forth with particularity in the appended claims. The invention itself however, both as to organization and method of operation, together with objects and advantages thereof, may be best understood be reference to the following detailed description of the invention, which describes certain exemplary embodiment of the invention, taken in conjunction with the accompanying drawings in which:

Figure 1:
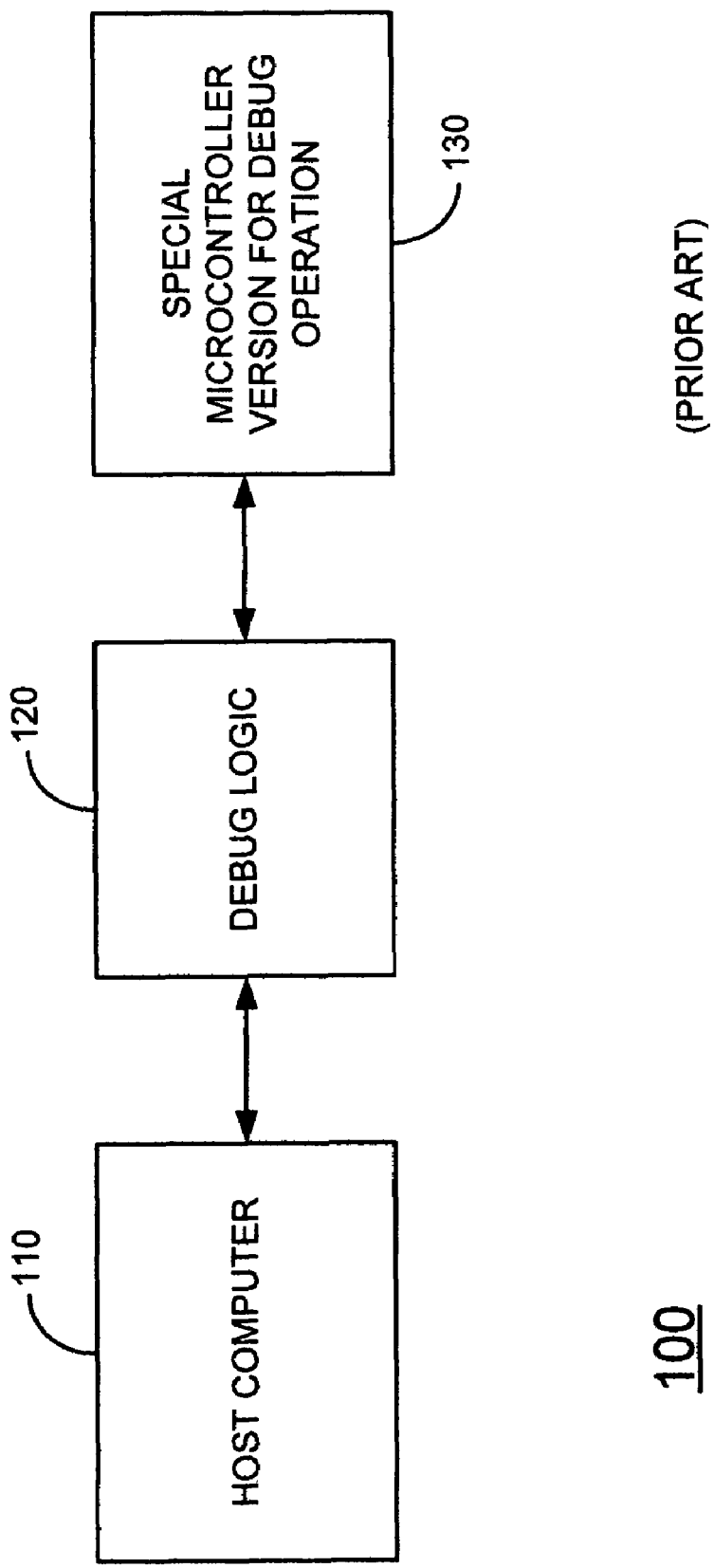
FIG. 1 (Prior Art) is a block diagram of a conventional in circuit emulator (ICE).

The accompanying drawings, which are incorporated in and form a part of this specification, illustrate embodiment of the invention and, together with the description, serve to explain the principles of the invention.

DETAILED DESCRIPTION OF THE PREFERRED EMBODIMENTS

Reference will now be made in detail to preferred embodiment of the invention, a system and a method for checking lock-step consistency between an ICE and a microcontroller, examples of which are illustrated in the accompanying drawings. While the invention will be described in conjunction with the preferred embodiments, it will be understood that they are not intended to limit the invention to these embodiments. On the contrary, the invention is intended to cover alternatives, modifications, and equivalents, which may be included within the spirit and scope of the invention as defined by the appended claims. Furthermore, in the following detailed description of the present invention, numerous specified details are set forth in order to provide a thorough understanding of the present invention. However, it will be obvious to one of ordinary skill in the art that the present invention may be practiced without these specific details. In other instances, well known methods, and circuits have not been described in detail as not to unnecessarily obscure aspects of the present invention.

In the following detailed description of the present invention, numerous specific details are set forth in order to provide a thorough understanding of the present invention. However, it will be recognized by one skilled in the art that the present invention may be practiced without these specific details or with equivalents thereof. In other instances, well known methods, procedures, components, and circuits have been described in detail as not necessarily obscure aspects of the present invention.

Notation and Nomenclature:

Some portions of the detailed descriptions which follow are presented in terms of procedures, steps, logic blocks, processing, and other symbolic representations of operations on data bits that can be performed on computer memory. These descriptions and representations are the means used by those skilled in the data processing arts to most effectively convey executed steps, logic block, process etc., is here, and generally, convinced to be self consistent sequence of steps or instructions leading to a desired result. The steps are those requiring physical manipulations of physical quantities.

Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be born in mind, however, that all of these and similar terms are to be those associated with the appropriate physical quantities and are merely convenient labels applied to those quantities. Unless specifically stated otherwise as apparent from the following discussions, it is appreciated that throughout the present invention, discussion utilizing terms such as "processing" or "transferring" or "executing" or "determining" or "instructing" or "issuing" or "halting" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Method and System of the Invention:

While this invention is susceptible of embodiment in many different forms, there is shown in the drawings and will herein be described in detail specific embodiment, with the understanding that the present disclosure is to be considered as an example of the principles of the invention and not intended to limit the invention to the specific embodiment shown and described. In the description below, like reference numerals are used to describe the same, similar or corresponding parts in the several views of the drawings.

A commercial ICE system utilizing the present invention is available from Cypress MicroSystems, Inc., for the CY8C25xxx/26xxx series of microcontrollers. Detailed information regarding this commercial product is available from Cypress MicroSystems, Inc., 22027 17th Avenue SE, Suite 201, Bothell, Wash. 98021, in the form of version 1.11 of "PSOC DESIGNER: Integrated Development Environment User Guide", which is hereby incorporated by reference. While the present invention is described in terms of an ICE system for the above exemplary microcontroller device, the invention is equally applicable to other complex circuitry including microprocessor and other circuitry that is suitable for analysis and debugging using in-circuit emulation. Moreover, the invention is not limited to the exact implementation details of the exemplary embodiment used herein for illustrative purposes.

Figure 2:
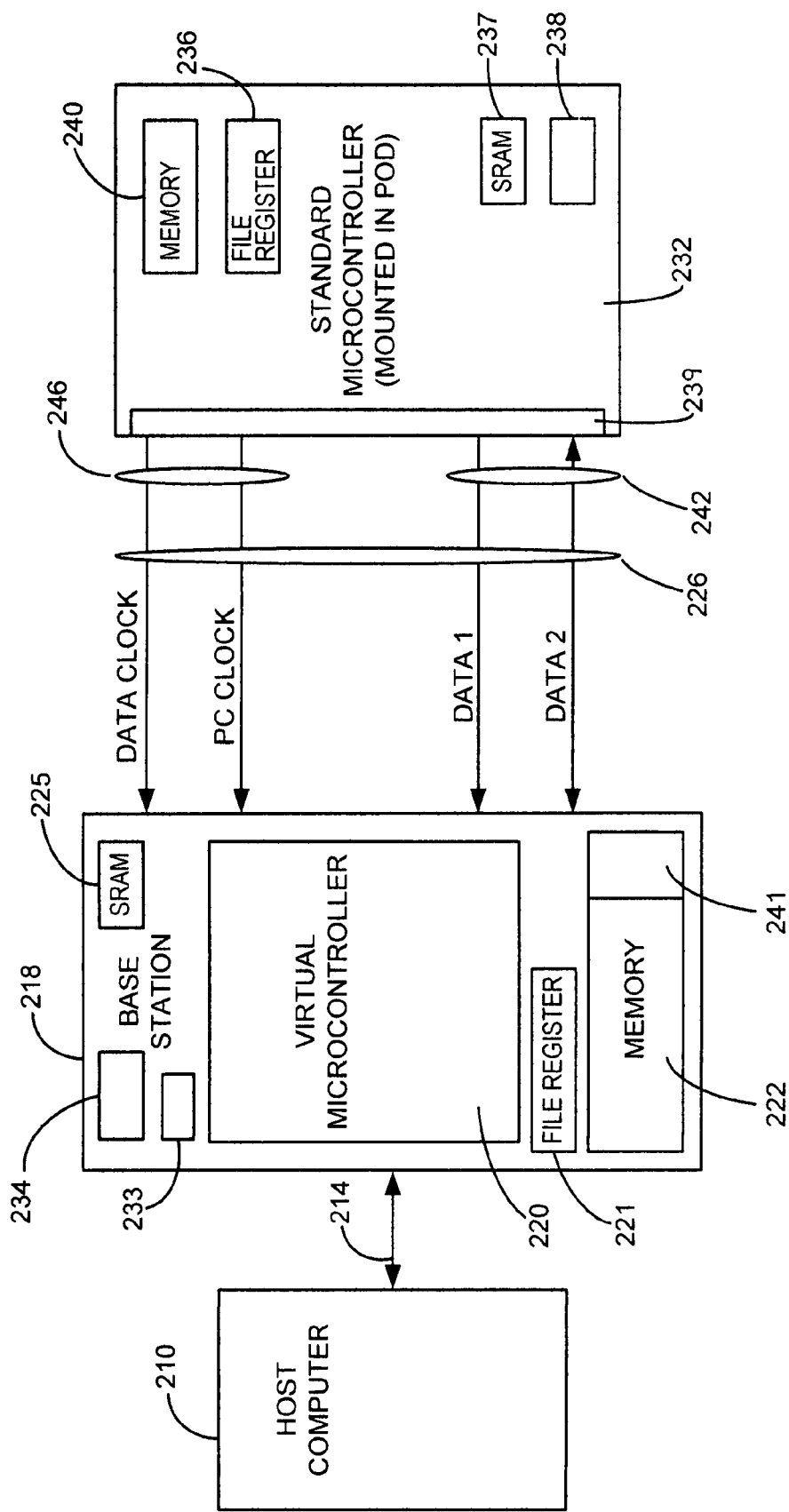
FIG. 2 is a block diagram of an exemplary in circuit emulation system consistent with certain microcontroller embodiments of the present invention.

Referring now to FIG. 2, an architecture for implementation of an embodiment of an ICE system of the present invention is illustrated as system 200. In system 200, a host computer 210 (e.g., personal computer based on a PENTIUM® class microprocessor) is connected (e.g., using a production PC interface 214 such as a parallel printer port connection, a universal serial bus (USB) connection, etc.) with a base station 218. The host computer 210 generally operates to run an ICE computer program to control the emulation process and further operates in the capacity of a logic analyzer to permit a user to view information provided from the base station 218 for use in analyzing and debugging a device under test or development. According to an embodiment of the present invention microcontroller 232, mounted on a pod, comprises file registers 236, SRAM 237, CPU register 238, memory 240, and a program counter 239.

The base station 218 is based upon a general purpose programmable hardware device such as a gate array configured to function as a functionally equivalent "virtual microcontroller" 220. This is accomplished using an associated integral memory 222 which stores program instructions, data, and other associated information. Base station 218 comprises of file register 221, SRAM 225, CPU register 234 and program counter 233. The base station 218 is configured as an emulator of the internal microprocessor portion of the microcontroller portion of the microcontroller 232. In preferred embodiments, a field programmable gate array FPGA (or other programmable logic device) is configured to function as the virtual microcontroller 220. The FPGA and virtual microcontroller 220 will be referred to interchangeably herein. The base station 218 further includes a trace buffer 241, which stores trace path of the code. The pod, in certain embodiments, provides connection to the microcontroller 232 that permits external probing as well as interconnection with other circuitry as might be used to simulate a system under development.

The FPGA of the base station 218 of the current embodiment is designed to emulate the core processor functionality (microprocessor functions, Arithmetic Logic Unit function, RAM, and ROM memory functions) of the Cypress Microsystems CY8C25xxx/26xxx series of microcontrollers. The CY8C25xxx/26xxx series of microcontrollers also incorporate limited I/O functions and an interrupt controller as well as programmable digital and analog circuitry. This circuitry need not be modeled using the FPGA 220. Instead the I/O read information, interrupt vector and other information can be passed to the FPGA 220 from the microcontroller 232 via interface 226 as will be described later.

The base station 218's virtual microcontroller 220 operates to execute the code programmed into production microcontroller 232 in lock-step operation with production microcontroller 232. Thus, the actual microprocessor 232 is freed of any need to provide significant special facilities for ICE, since any such facilities can be provided in the virtual microcontroller 220. The base station 218's virtual microcontroller and microcontroller 232 execute all steps of the program under test and in lock-step without a need to communicate except when a break point or a halt state is encountered. The combination of production and virtual microcontroller behaves just as the microcontroller 232 would alone under normal operation conditions. I/O reads and interrupts vectors are transferred from the microcontroller 232 to the base station 218. Base station 218 is then able to provide the host computer 210 with the I/O reads and interrupts vectors as well as an array of information internal to the microcontroller 232 within memory and register locations that are otherwise inaccessible.

In the designing of a microcontroller or other complex circuit such as the microcontroller 232, it is common to implement the design using the VERILOG® language (or other suitable language). Thus, it is common that the full functional design description of the microcontroller is fully available in a software format. The base station 218 of the current embodiment is based upon the commercially available SPARTAN® series of FPGAs from Xilinx, Inc., 2100 Logic Drive, San Jose, Calif. 95124. The VERILOG® description can be used as the input to the FPGA design and synthesis tool available from the FPGA manufacturer to realize the virtual microcontroller 220 (generally after timing adjustments and other debugging). Thus, design and realization of the FPGA implementation of an emulator for the microcontroller (virtual microcontroller) or other device can be readily achieved by use of a VERILOG description along with circuitry to provide interfacing to the base station and the device under test (DUT).

In the embodiment described in connection with FIG. 2, the actual production microcontroller 232 carries out its normal functions in the intended application and passes. I/O information and other information needed for debugging to the base station 218 only at a breakpoint or when in halt state. The virtual microcontroller 220 implemented within the FPGA of base station 218 serves to provide the operator with visibility into the core processor functions that are inaccessible in the production microcontroller 232. Thus, the FPGA 220, by virtue of operating in lock-step operation with the microcontroller 232 provides an exact duplicate of internal CPU registers contents, memory contents, interrupt vectors and other useful debug information. Additionally, trace buffer 241 can be used to store information useful in trace operations that is gathered by the FPGA 220 during execution of the program under test. This architecture, therefore, permits the operator to have visibility into the inner workings of the microcontroller 232 without need to provide special bound-outs and expensive circuitry on the microcontroller itself.

The base station 218's FPGA based virtual microcontroller 220, operating under the control of host computer 210, carries out the core processor function of microcontroller 232 and thus contains a functionally exact copy of the CPU registers 238 contents and SRAM 237 contents of the production microcontroller 232. The ICE system starts both microcontrollers (production and virtual) at the same time and keeps them running in synchronization. One embodiment of the present invention provides a consistency check whenever the system is halted (i.e., when the system is not emulating), or when the system encounters a breakpoint (e.g., sleep, stall, internal start/stop, stalls, etc.).

For example, whenever production microcontrollers 232 and virtual microcontroller 220 are running a code the execution of the code is in lock-step. In other words, the two microcontrollers are running the same code, they start running the code at the same time, they hit the same breakpoint, and they stop at the same line of code. To ensure the integrity of the debugging process in production microcontrollers 232 and virtual microcontroller 220, a consistency check is performed at any opportune time. It is appreciated that computer system 210 and the host device 210 are referred to interchangeably herein.

For example a consistency check may be conducted when the execution of the debugging operation is halted. The consistency check comprises: comparing a content of SRAM 225 and a content of SRAM 237, and comparing a content of CPU register 234 and a content of CPU register 238. The software in the host device 210 reads back the content of SRAM 225 and the content of SRAM 237 into memory 222. The software program residing in host device 210 compares the contents of the two SRAMs 225 and 237 to verify the consistency. If the contents of the two SRAMs 225 and 237 are not consistent the software in the host device 210 issues a signal indicating a "lock-step error". Similarly, the software in the host device 210 may compare a content of CPU register 234 and a content of production microcontroller CPU register 238 for consistency verification. In a similar manner the software in host device 210 reads back a content of CPU register 238 and a content of CPU register 234 into memory 222. The software program residing in host device 210 compares the contents of the two CPU registers 234 and 238 and signals "lock-step error" if the contents of the two CPUs registers 234 and 238 are not matching.

When a lock-step error signal is detected, the user checks the trace buffers 241. The trace buffer 241, residing in the base station 218, keeps track of each line of code executed. Examining trace buffer 241 the user can determine which line of code caused the halt. Trace buffer also keeps track of the contents of CPU registers on each line of code. The user can back track the execution of each line of code and the associated CPU registers to find the exact line of code where the content of CPU register 238 and the content of CPU register 234 diverged as a result of a faulty code. Once the code is debugged the debugging process will resume. It is appreciated that CPU register 234 and SRAM 225 in the base station 218 and CPU register 238 and SRAM 237 in production microcontroller 232 are initialized with zeros to ensure the integrity of the tracing and the consistency checking.

Similarly, when a breakpoint is encountered, a lock-step consistency check may be conducted. The lock-step operation of the microcontroller 232 and the virtual microcontroller 220 requires the virtual microcontroller 220 and production microcontroller 232 to start running a microcontroller code at the same time, run each line of the microcontroller code at the same time, have the same CPU register content and the same SRAM content on both sides, and to stop at the exactly same line of code when a breakpoint is encountered. Therefore, at a breakpoint the software in the host device 210 will conduct a consistency check as described above and if there is a mismatch of memory CPU register content or SRAM content the host device 210 will issue a "lock-step error" signal.

In the embodiment illustrated, the basic interface used is a four line interface between microcontroller 232 and base station 218. This interface permits use of a Category Five patch cable to connect the microcontroller 232 and base station 218 in one embodiment, but of course, this is not to be considered limiting. The four wire interface 226 of the present embodiment can be functionally divided into two functional portions. A data transport portion 242 carries two data lines in the current embodiment. A clock portion 246 carries a data clock plus the microcontroller clock signal for the microcontroller 232. Three additional lines are also provided (not shown) for supply, ground and reset line. But, the data transport portion 242 and the clock portion 246 are of primary interest, since the supply and reset functions can be readily provided in any other suitable manner.

The two portions of the interface are implemented in the current embodiment using four lines as described, however, in other embodiments, these two portions can be implemented with as few as two wires. In the current embodiment, the microcontroller clock signal can be varied by programming (even dynamically during execution of a program). Therefore, it is desirable to have two clock signals-microcontroller clock to easily track the microcontroller clock timing as well a system clock that regulates the data transfer and other operations. However, in other embodiments, particularly where a clock frequency is not changed dynamically, a single clock can be used. The single clock can be multiplied or divided as required to implement the required clocking signal.

The present embodiment uses an eight bit microcontroller that only reads eight bits at a time on any given I/O read. Thus, the present microcontroller 232 needs only to effect serializing and transferring a maximum of one eight bit I/O read for each instruction cycle. This is easily accommodated using two data lines transferring four bits each over four system clock cycles. However, using a clock, which is two times faster, a single line could equally well transfer the data in the same time. Similarly, four lines could be used to transfer the same data in a short enough time to permit the virtual microcontroller 220 to process the data and issue any needed response before the next instruction cycle begins. The time required to accomplish this is held at a minimum in the current invention, since the system synchronization eliminates need for any overhead protocol for transmission of the data.

The present embodiment uses a four line communication interface and method of communication between the FPGA within base station 218 (acting as a "virtual microcontroller" 220 or ICE) and the production microcontroller device under test (microcontroller 232). The four line communication interface is time-dependent so that different information can be transferred at different times over a small number of communication lines. Moreover, since the two processors operate in lock-step, there is no need to provide bus arbitration, framing, or other protocol overhead to effect the communication between the microcontroller 232 and the virtual microcontroller 220. This interface is used for, among other things, transferring of I/O data from the microcontroller 232 to the FPGA 220 (since FPGA emulates only the core processor functions of the microcontroller in the current embodiment). A first interface line (data1) is a data line used by the microcontroller 232 to send I/O data to FPGA based virtual microcontroller 220. This line is also used to notify the FPGA 220 of pending interrupts. This data1 line is only driven by the production microcontroller 232. A second data line (Data2), which is bi-directional, is used by the microcontroller 232 to send I/O data to FPGA based virtual microcontroller of base station 218. In addition, the FPGA 220 uses the Data2 line to convey halt requests (i.e., to implement simple or complex breakpoints) to the microcontroller 232.

A third interface line is a 24/48 Mhz data clock used to drive the virtual microcontroller 220's communication state machines (the logic used within the state controller to communicate with the microcontroller 232). In the current embodiment, this clock always runs at 24 Mhz unless the microcontroller 232's internal clock is running at 24 Mhz. In this case the system clock switches to 48 Mhz. Of course, these exact clock speeds are not to be considered limiting, but are presented as illustrative of the current exemplary embodiment. The fourth interface line is the internal microcontroller clock from the microcontroller 232.

A fifth line can be used to provide a system reset signal to effect the simultaneous startup of both microcontrollers. This fifth line provides a convenient mechanism to reset the microcontrollers, but in most environments, the simultaneous startup can also be effected in other ways including switching of power. Sixth and seventh lines are provided in the current interface to provide power and ground for power supply The base station 218's virtual microcontroller 220 communicates with the microcontroller 232 via four signal and clock lines forming a part of the four line interface 226 forming a part of a seven wire connection as described below. The interface signals travel over a short (e.g., one foot) of CAT 5 network cable. The ICE transmits break commands to the microcontroller 232 via the base station 218, along with register read/write command when the microcontroller 232 is halted. The microcontroller 232 uses the interface to return register information when halted, and to send I/O read, interrupt, vector, and watchdog information while running. The microcontroller 232 also sends a copy of its internal clocks for the ICE.

Synchronization between the microcontroller 232 and the virtual microcontroller 220 is achieved by virtue of their virtually identical operation. They are both started simultaneously by a power on or reset signal. They then track each other's operation continuously executing the same instructions using the same clocking signals. The system clock signal and the microcontroller clock signal are shared between the two microcontrollers (production and virtual) so that even if the microprocessor clock is changed during operation, they remain in lock-step.

In accordance with certain embodiment of the invention, a mechanism is provided for allowing the FPGA 220 of base station 218 and the microcontroller 232 to stop at the same instruction in response to a break-point event (a break or halt). The FPGA 220 has the ability to monitor the microcontroller states of microcontroller 232 for a breakpoint event, due to its lock-step operation with microcontroller 232. In the process of executing an instruction, an internal start of instruction cycle (SOI) signal is generated (by both microcontrollers) that indicates that the device is about to execute a next instruction. If a break point signal (a halt or break signal—the term "halt" and "break" are used synonymously herein) is generated by the FPGA, the execution of the microcontroller 232 can be stopped at the SOI signal point before the next instruction starts.

Figure 3:
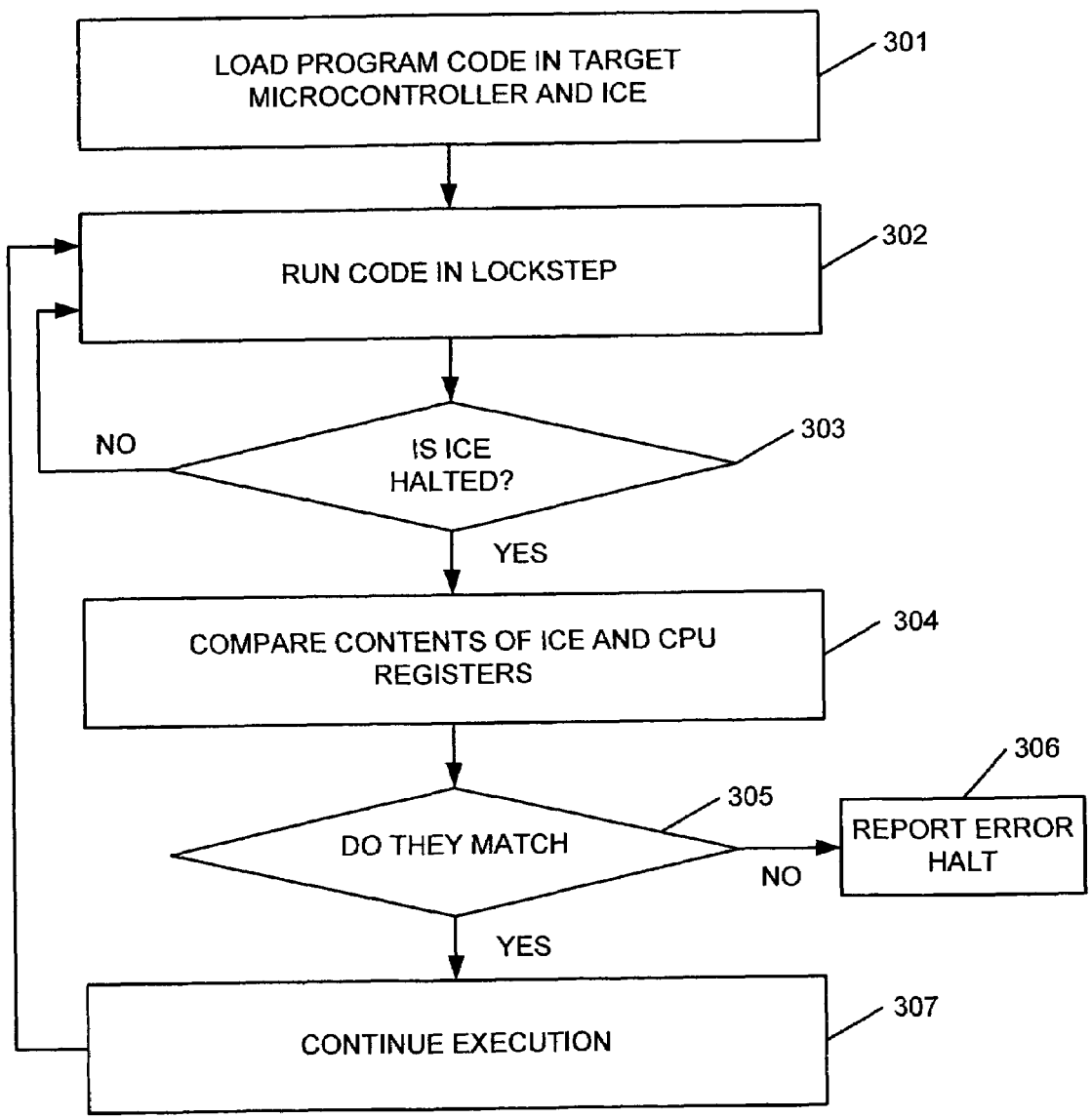
FIG. 3 is an illustration of checking the consistency of lock-step execution of a debugging process at a halt state.

FIG. 3 is a flow chart of the steps of a microcontroller code debugging process 300 in accordance with one embodiment of the present invention. As depicted in FIG. 3, process 300 shows the steps involved in debugging microcontroller code using a lock step execution ICE system (e.g., system 200 of FIG. 2).

Process 300 begins in step 301 where microcontroller program code is loaded into a target microcontroller and an ICE. As described above, the debugging process begins by initializing a first memory of the ICE and a second memory of the microcontroller with microcontroller test code. This test code typically comprises a microcontroller application requiring testing with multiple microcontroller configurations, settings, conditions, and the like. In step 302, code execution subsequently begins with the code being executed on both the microcontroller (e.g., the target microcontroller) and the ICE in lock step.

In step 303, process 300 determines whether the ICE is halted. A halt can occur due to, for example, a break point being encountered in the code. If the ICE is halted, process 300 proceeds to step 304. If no halt is encountered, process 300 proceeds back to step 302 where lock step execution continues.

In steps 304 and 305 lock step execution of the microcontroller code is checked and verified. In step 304 the content of the memories (RAM, SRAM, CPU registers, etc.) of the ICE and the microcontroller are compared. If the contents match, lock step execution is verified and process 300 proceeds to step 307 where execution continues. If the contents do not match, process 300 proceeds to step 306 where an error is reported and execution is halted.

The foregoing descriptions of specific embodiments of the present invention have been presented for purpose of illustration and description. They are not intended to be exhaustive or to limit the invention to the precise form disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method for debugging microcontroller code comprising:
   a) programming said microcontroller code into a target microcontroller including a first memory and into an in circuit emulator base station including a second memory, a trace buffer, and a target microcontroller emulator which is not identical to and emulates operation of said target microcontroller and initializing said first memory and said second memory;
   b) executing the microcontroller code on the target microcontroller and on the target microcontroller emulator in lock step by executing same instructions using same clocking signals;
   c) verifying lock step of said executing step by comparing content of the first memory and content of the second memory when said target microcontroller encounters a breakpoint and said executing step halts;
   d) if lock step of said executing step is not verified, reporting an error, saving an execution history using said trace buffer and debugging said microcontroller code; and
   e) if lock step of said executing step is verified, continuing execution of the microcontroller code.

2. The method of claim 1 further comprising:
   locating an error within the microcontroller code by tracing the execution history using the trace buffer.

3. The method of claim 1 wherein said first memory includes a first central processing unit (CPU) register and wherein said second memory includes a second CPU register, wherein said method further comprises:
   verifying lock step of said executing step by comparing contents of the first CPU register and contents of the second CPU register.

4. The method of claim 1 wherein said in circuit emulator base station comprises a field programmable gate array (FPGA), and wherein said target microcontroller emulator is programmed into said FPGA.

5. The method of claim 1 wherein the target microcontroller is a production microcontroller.

6. A system for debugging microcontroller code, comprising:
- a target microcontroller including a first memory;
- an in circuit emulator base station including a second memory and a target microcontroller emulator which is not identical to and emulates operation of said target microcontroller, wherein said target microcontroller and said target microcontroller emulator execute said microcontroller code, wherein said microcontroller code execution occurs in lock step by executing same instructions using same clocking signals; and
- an interface coupled to said target microcontroller and said in circuit emulator base station, wherein lock step of said microcontroller code execution is verified by comparing said first memory with said second memory when said target microcontroller encounters a breakpoint and said microcontroller code execution halts, and wherein a mismatch between said first and second memories initiates debugging said microcontroller code.

7. The system as recited in claim 6 wherein the target microcontroller is installed on a pod.

8. The system as recited in claim 6 wherein said in circuit emulator base station includes a field programmable gate array (FPGA), and wherein said target microcontroller emulator is programmed into said FPGA.

9. The system as recited in claim 6 wherein the first memory includes a first static random access memory (SRAM) and the second memory includes a second SRAM.

10. The system as recited in claim 6 wherein the first memory includes a first central processing unit (CPU) register and the second memory includes a second CPU register.

11. The system as recited in claim 6 wherein lock step of said microcontroller code execution is maintained by synchronizing said target microcontroller and said target microcontroller emulator.

12. The system as recited in claim 6 wherein said target microcontroller is a production microcontroller.

13. The system as recited in claim 6 wherein said in circuit emulator base station includes a trace buffer.

14. A system for maintaining lock step execution of microcontroller code during debugging, comprising:
- a target microcontroller including a first memory;
- an in circuit emulator base station including a second memory and a target microcontroller emulator which is not identical to and emulates operation of said target microcontroller, wherein said target microcontroller and said target microcontroller emulator execute said microcontroller code, wherein said microcontroller code execution occurs in lock step by executing same instructions using same clocking signals;
- a computer system coupled to said in circuit emulator base station and controlling debugging of said microcontroller code; and
- an interface coupled to said target microcontroller and said in circuit emulator base station, wherein lock step of said microcontroller code execution is verified by said computer system by comparing said first memory with said second memory when said target microcontroller encounters a breakpoint and said microcontroller code execution halts, and wherein a mismatch between said first and second memories initiates debugging said microcontroller code.

15. The system as recited in claim 14 wherein the target microcontroller is installed on a pod.

16. The system as recited in claim 14 wherein said in circuit emulator base station includes a field programmable gate array (FPGA), and wherein said target microcontroller emulator is programmed into said FPGA.

17. The system as recited in claim 14 wherein the first memory includes a first central processing unit (CPU) register and the second memory includes a second CPU register.

18. The system as recited in claim 14 wherein said in circuit emulator base station includes a trace buffer.

19. The system as recited in claim 14 wherein the target microcontroller is a production microcontroller.

* * * * *